(12) United States Patent
Li et al.

(10) Patent No.: US 12,731,706 B1
(45) Date of Patent: Sep. 8, 2026

(54) SYSTEMS AND METHODS FOR IMPLEMENTING PSEUDO-RESISTORS WITH PROGRAMMABLE RESISTANCE AND CONTROLLED LEAKAGE

(71) Applicant: Avago Technologies International Sales Pte. Limited, Singapore (SG)

(72) Inventors: Shengyuan Li, Irvine, CA (US); Jing Guo, Irvine, CA (US); Vinay Chandrasekhar, Irvine, CA (US); Xicheng Jiang, Irvine, CA (US); Min Gyu Kim, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 19/075,317

(22) Filed: Mar. 10, 2025

(51) Int. Cl.
*H01C 1/16* (2006.01)
*H03K 17/687* (2006.01)

(52) U.S. Cl.
CPC ............. *H01C 1/16* (2013.01); *H03K 17/687* (2013.01)

(58) Field of Classification Search
CPC ................................ H01C 1/16; H03K 17/687
USPC ................................................. 327/530, 534
See application file for complete search history.

(56) References Cited

U.S. PATENT DOCUMENTS 10,714,242 B2 * 7/2020 Abel ...................... H01C 10/16
2003/0094958 A1 * 5/2003 Stave ..................... G01R 27/08 324/691
2013/0069716 A1 * 3/2013 Shiue ..................... H03H 11/53 327/581
2017/0070209 A1 * 3/2017 Takase ................ H03F 3/45475
2017/0272036 A1 * 9/2017 Wu ....................... H03F 1/0205
2018/0234081 A1 * 8/2018 Hung .................. H03H 11/245
2022/0206100 A1 * 6/2022 Chen ................... G01R 35/005
2024/0223161 A1 * 7/2024 Chang .................... H03K 3/011

* cited by examiner

*Primary Examiner* — William Hernandez
(74) *Attorney, Agent, or Firm* — Quarles & Brady LLP

(57) ABSTRACT

The subject technology is directed to electronic circuits. In an embodiment, the subject technology provides an apparatus that includes a resistor unit comprising a first transistor and a second transistor. The first transistor includes a first terminal and the second transistor includes a second terminal. The first terminal is coupled to the second terminal. The resistor unit is configured to provide a first resistance between the first terminal and the second terminal. The apparatus further includes a reset unit coupled to the resistor unit and configured to provide a second resistance between the first terminal and the second terminal in response to a control signal. The second resistance is lower than the first resistance. The subject technology provides a reset mechanism that enables fast recovery from high-resistance states, ensuring precise resistance control and improved performance in high-impedance applications.

20 Claims, 3 Drawing Sheets

SYSTEMS AND METHODS FOR IMPLEMENTING PSEUDO-RESISTORS WITH PROGRAMMABLE RESISTANCE AND CONTROLLED LEAKAGE

FIELD OF INVENTION

The subject technology is directed to electronic circuits.

BACKGROUND OF THE INVENTION

Resistors are important components in electronic systems, providing impedance control, voltage division, and signal conditioning in a wide range of applications. In many applications, such as analog front-end circuits of biosensing systems, low-power electronics, and precision instrumentation, extremely high resistance values—often in the gigaohm (GΩ) range or higher—are required to properly process weak signals and maintain high input impedance.

Achieving such high resistance in an integrated circuit (IC) environment presents significant challenges. Many approaches rely on passive resistor implementations, such as thin-film or polysilicon resistors, which often result in excessive silicon area consumption, making them impractical for high-density designs. Furthermore, variations in operating conditions, such as supply voltage, process parameters, and temperature fluctuations, can impact resistance stability, leading to inconsistent performance in high-precision applications.

In applications such as biosignal acquisition, sensor readout, and high-impedance analog circuits, maintaining predictable resistance characteristics is beneficial for ensuring accurate signal processing and minimizing distortion. Without precise control over resistance values, circuit performance may degrade, leading to reduced signal fidelity and compromised overall system reliability.

Various approaches for improving the stability, tunability, and leakage performance of resistor implementations have been explored, but they have proven to be insufficient. It is important to recognize the need for new and improved systems and methods.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
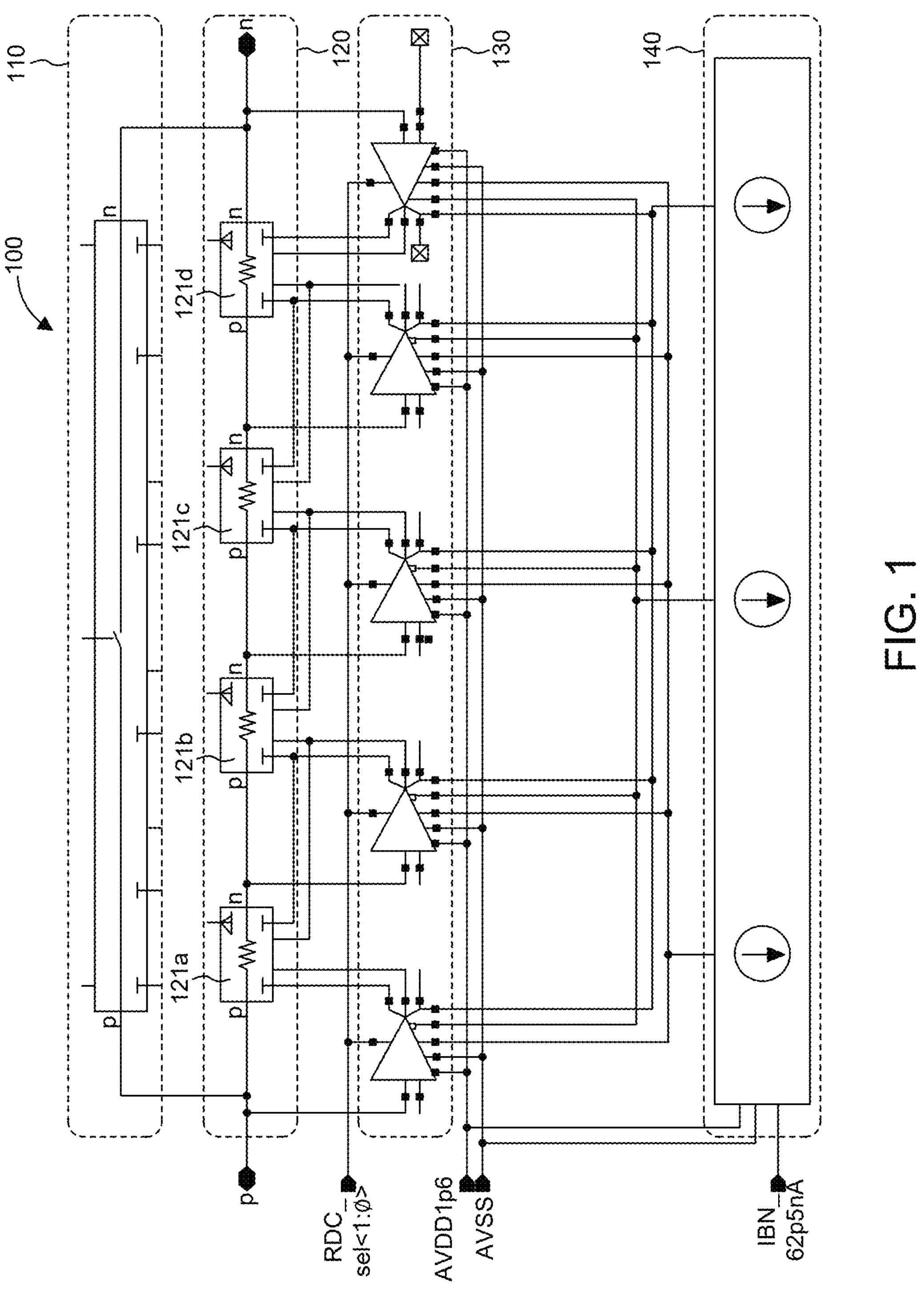
FIG. 1 is a simplified diagram illustrating a pseudo-resistor system according to embodiments of the subject technology.

The subject technology is directed to electronic circuits. In an embodiment, the subject technology provides an apparatus that includes a resistor unit comprising a first transistor and a second transistor. The first transistor includes a first terminal and the second transistor includes a second terminal. The first terminal is coupled to the second terminal. The resistor unit is configured to provide a first resistance between the first terminal and the second terminal. The apparatus further includes a reset unit coupled to the resistor unit and configured to provide a second resistance between the first terminal and the second terminal in response to a control signal. The second resistance is lower than the first resistance. A first circuit is coupled to the resistor unit and configured to adjust the first resistance by providing a bias voltage to the first transistor or the second transistor. A second circuit is coupled to the first circuit and configured to adjust the bias voltage by providing a bias current to the first circuit. The subject technology provides a reset mechanism that enables fast recovery from high-resistance states, ensuring precise resistance control and improved performance in high-impedance applications.

As previously noted, achieving extremely high resistance values in an IC environment presents significant challenges. To address these challenges, some approaches involve the use of pseudo-resistors. For example, the term "pseudo-resistors" may refer to resistive structures implemented using active devices instead of resistive materials. Pseudo-resistors may be implemented using metal-oxide-semiconductor field-effect transistors (MOSFETs) operating in weak inversion or subthreshold conduction, where the drain current is exponentially dependent on the gate-source voltage, resulting in extremely high resistance values. These structures have been developed as a compact alternative to achieve high resistance in ICs while reducing area consumption. Pseudo-resistors are widely used in low-power analog circuits, biomedical instrumentation amplifiers, and sensor readout circuits, where precise high-impedance characteristics are needed to process weak signals with minimal distortion.

However, achieving a stable and tunable resistance in pseudo-resistors remains challenging due to several factors, including process variations, bias voltage dependence, temperature sensitivity, and/or leakage currents. Many pseudo-resistor implementations often suffer from uncontrolled leakage currents, which can introduce signal distortion and degrade system performance, such as in biosignal acquisition, high-impedance front-end amplifiers, and other precision circuits requiring stable resistance values. Additionally, many pseudo-resistor implementations lack an effective mechanism for rapid resistance recovery, leading to saturation effects that degrade performance and slow system response.

In various implementations, the subject technology provides systems and methods for implementing pseudo-resistors with an integrated reset mechanism and an extended linear resistance range. By incorporating a reset unit, the system enables rapid resistance reconfiguration, preventing charge accumulation and saturation effects that could degrade performance. The system further utilizes intermediate node biasing and cascaded transistor arrangements to extend the linear operating range, ensuring predictable and precise resistance characteristics across varying voltage conditions. Accordingly, the subject technology enables robust and efficient high-resistance implementations for applications requiring high-impedance characteristics, such as biosignal acquisition, precision analog front-end circuits, and/or sensor interfaces.

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the subject technology is not intended to be limited to the embodiments presented but is to be accorded the widest scope consistent with the principles and novel features disclosed herein.

In the following detailed description, numerous specific details are set forth in order to provide a more thorough understanding of the subject technology. However, it will be apparent to one skilled in the art that the subject technology may be practiced without necessarily being limited to these specific details. In other instances, well-known structures and devices are shown in block diagram form, rather than in detail, in order to avoid obscuring the subject technology.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require the selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes an apparatus, which comprises a first resistor unit comprising a first terminal and a second terminal, the first resistor unit being configured to provide a first resistance between the first terminal and the second terminal. The first resistor unit further comprises a first transistor coupled to the first terminal and a second transistor coupled to the second terminal. The apparatus further comprises a first reset unit coupled to the first terminal and the second terminal, the first reset unit being configured to provide a second resistance between the first terminal and the second terminal in response to a first control signal, the second resistance being lower than the first resistance. The apparatus further comprises a first circuit coupled to the first resistor unit, the first circuit being configured to adjust the first resistance by providing a first bias voltage to the first resistor unit. The apparatus further comprises a second circuit coupled to the first circuit, the second circuit being configured to adjust the first bias voltage by providing a first bias current to the first circuit.

Implementations may include one or more of the following features. The first transistor comprises a first source terminal and a first body terminal, the first source terminal is electrically coupled to the first body terminal. The first reset unit comprises a first isolated well region coupled to the first terminal. The first terminal is coupled to the second terminal via a first node, the first node being characterized by a first voltage. The first reset unit comprises a third transistor and a fourth transistor, the third transistor is coupled to the fourth transistor via a second node, the second node is characterized by a second voltage, the second voltage is associated with the first voltage. The apparatus further comprises a second resistor unit coupled to the first resistor unit via a third node, the third node being characterized by a third voltage. The apparatus further comprises a second reset unit coupled to the first reset unit via a fourth node, the fourth node being characterized by a fourth voltage, the fourth voltage being associated with the third voltage. The first resistor unit further comprises a second isolated well region and a fifth transistor, the fifth transistor is coupled to the first transistor and the second isolated well region. The first resistor unit further comprises a sixth transistor, the sixth transistor is coupled to the second transistor and the second isolated well region.

According to another embodiment, the subject technology provides an apparatus that comprises a first resistor unit comprising a first terminal and a second terminal, the first resistor unit being configured to provide a first resistance between the first terminal and the second terminal, the first resistor unit further comprising a first transistor coupled to the first terminal and a second transistor coupled to the second terminal. The apparatus further comprises a first reset unit coupled in series with the first resistor unit, the first reset unit being configured to provide a second resistance between the first terminal and the second terminal in response to a first control signal, the second resistance being lower than the first resistance. The apparatus further comprises a first circuit coupled to the first resistor unit, the first circuit being configured to adjust the first resistance by providing a first bias voltage to the first resistor unit. The apparatus further comprises a second circuit coupled to the first circuit, the second circuit being configured to adjust the first bias voltage by providing a first bias current to the first circuit.

Implementations may include one or more of the following features. The first transistor comprises a first source terminal and a first body terminal, the first source terminal is electrically coupled to the first body terminal. The first terminal is coupled to the second terminal via a first node, the first node being characterized by a first voltage. The first reset unit comprises a third transistor and a fourth transistor, the third transistor is coupled to the fourth transistor via a second node, the second node is characterized by a second voltage, the second voltage is associated with the first voltage. The first node is configured to receive a second bias voltage from the first circuit. The apparatus further comprises a second resistor unit coupled to the first resistor unit via a third node, the third node being characterized by a third voltage. The apparatus further comprises a second reset unit coupled to the first reset unit via a fourth node, the fourth node being characterized by a fourth voltage, the fourth voltage being associated with the third voltage.

According to yet another embodiment, the subject technology provides an apparatus, which comprises a first resistor unit comprising a first terminal and a second terminal, the first resistor unit being configured to provide a first resistance between the first terminal and the second terminal, the first resistor unit further comprising a first transistor coupled to the first terminal and a second transistor coupled to the second terminal. The apparatus further comprises a first reset unit coupled to the first resistor unit, the first reset unit comprising a third transistor coupled to the first terminal and a fourth transistor coupled to the second terminal, the first reset unit being configured to provide a second resistance between the first terminal and the second terminal in response to a first control signal, the second resistance being lower than the first resistance. The apparatus further comprises a first circuit coupled to the first resistor unit, the first circuit being configured to adjust the first resistance by providing a first bias voltage to the first resistor unit. The apparatus further comprises a second circuit coupled to the first circuit, the second circuit being configured to adjust the first bias voltage by providing a first bias current to the first circuit. In various embodiments, the first terminal is coupled to the second terminal via a first node, the first node being characterized by a first voltage. The third transistor is coupled to the fourth transistor via a second node, the second node is characterized by a second voltage, the second voltage is associated with the first voltage. The apparatus further comprises a second resistor unit coupled to the first resistor unit via a third node, the third node being characterized by a third voltage.

FIG. 1 is a simplified diagram illustrating a pseudo-resistor system 100 according to embodiments of the subject technology. This diagram merely provides an example, which should not unduly limit the scope of the claims. One of ordinary skill in the art would recognize many variations, alternatives, and modifications. Pseudo-resistor system 100 may be implemented in various applications, including biosensing systems, low-power analog front-end (AFE) circuits, instrumentation amplifiers, sensor readout circuits, and/or other electronic systems requiring high-impedance characteristics. Depending on the application, pseudo-resistor system 100 may incorporate various features such as programmable resistance tuning, bias voltage control, temperature compensation, leakage current management, and/or the like.

As shown, system 100 includes at least one of reset switch 110, resistor array 120, first circuit 130, second circuit 140, and/or the like. These components work together to provide a tunable, high-resistance path while minimizing leakage and ensuring stable performance across varying conditions. For instance, system 100 is designed to achieve gigaohm (GΩ)-range resistance values and may be applied in bio-potential signal readout applications. Bio-potential signals—such as those measured in electrooculography (EOG), electroencephalography (EEG), electrocardiography (ECG) and/or electromyography (EMG)—operate at low voltage levels and within specific frequency ranges. These signals often exhibit low-frequency components spanning from sub-Hz to kilohertz (kHz) and are susceptible to electrode offset voltages generated at the skin-electrode interface. To accurately extract bio-potential signals, the readout front-end circuit may implement a high-pass filtering characteristic to reject unwanted DC offsets caused by electrode-skin interactions, necessitating an extremely high resistance when combined with an on-chip capacitor in the picofarad (pF) range.

In various implementations, resistor array 120 is configured to provide a controllable high-resistance path between two terminals, such as an input terminal and an output terminal (e.g., p and n terminals). For example, the term "resistor array" may refer to an electronic circuit or device comprising one or more resistor units arranged to provide resistance to current flow. Depending on the application, the resistance value may be fixed, adjustable, programmable, or dynamically controlled.

In some examples, resistor array 120 may include one or more resistor units (e.g., resistor units 121*a*, 121*b*, 121*c*, 121*d*), each contributing to the overall resistance and programmability of system 100. For example, the term "resistor unit" may refer to an electronic circuit or device that provides resistance to current flow. Depending on the implementation, one or more resistor units (e.g., resistor units 121*a-d*) may be connected in series, parallel, or hybrid configurations to achieve a wide range of resistance values. It is to be appreciated that the number of resistor units may be adjusted based on the desired resistance range, allowing system 100 to achieve extremely high resistance values (e.g., in the gigaohm (GΩ) range).

Each resistor unit (e.g., resistor units 121*a-d*) may be implemented using various circuit techniques, such as passive resistors, active transistor-based resistors, digitally programmable resistor arrays, and/or the like. For example, resistor units (e.g., resistor units 121*a-d*) may be implemented using transistors, which may include, without limitation, MOSFETs, bipolar junction transistors (BJTs), junction field-effect transistors (JFETs), and/or the like. In certain embodiments, a resistor unit may be referred to as a "pseudo-resistor unit," such as when implemented using transistor-based structures. The terms "resistor unit" and "pseudo-resistor unit" may be used interchangeably herein unless otherwise specified. As an example, each resistor unit may be implemented using MOS transistors operating in weak inversion or subthreshold conduction, allowing it to achieve extremely high resistance values in the gigaohm (GΩ) range or higher while occupying minimal silicon area.

In some embodiments, resistor array 120 is configured to provide a programmable resistance value. For instance, each resistor unit (e.g., resistor units 121*a*-121*d*) may be individually configurable, enabling discrete or continuous resistance tuning. This programmability may be achieved by applying a bias voltage to one or more terminals of the resistor unit, effectively tuning the device's resistance characteristic. For instance, the bias voltage may be generated by an external control circuit (e.g., first circuit 130), enabling resistance adjustment to accommodate varying circuit conditions or signal processing requirements.

In various implementations, resistor array 120 may be designed to support multiple resistance settings, allowing for discrete or continuous adjustments through selectable bias voltages or controlled bias current sources. In an example, each resistor unit (e.g., resistor units 121*a*-121*d*) may have four selectable resistance values (e.g., 30 GΩ, 40 GΩ, 50 GΩ, and 60 GΩ), which, when combined in a series configuration, allow the total resistance to be adjusted to 120 GΩ, 160 GΩ, 200 GΩ, or 240 GΩ, depending on the selection.

In certain configurations, resistor array 120 may be designed to support a reset operation, allowing it to transition between normal and reset states in case of saturation, excessive charge accumulation, or transient disturbances. For instance, reset switch 110 is coupled to resistor array 120 and is configured to provide a low-resistance bypass path when activated. For example, the term "reset switch" may refer to an electronic circuit or component configured to selectively alter the electrical characteristics of a system. For example, reset switch 110 is configured to temporarily bypass, short-circuit, or modify the impedance of resistor array 120, allowing system 100 to recover from saturation, excessive charge accumulation, or undesired transient conditions. A reset switch may be implemented using various switching elements, such as MOSFETs, BJTs, mechanical relays, transmission gates, and/or the like. Depending on the implementation, reset switch 110 may be controlled by an external control signal, a feedback mechanism, or an integrated control logic circuit that monitors the operational state of resistor array 120.

In some embodiments, reset switch 110 may enable a rapid reset mechanism by temporarily shorting the high-resistance path of resistor array 120, effectively discharging accumulated charge and restoring the circuit to a predefined initial state. This prevents unwanted drift in resistance characteristics and ensures consistent operation of resistor array 120 across varying conditions. For instance, reset switch 110 may include one or more reset units coupled in parallel with resistor units (e.g., resistor units 121*a-d*), such that activation of reset switch 110 effectively reduces the effective resistance between p and n terminals by establishing a temporary conduction path. In one embodiment, reset switch 110 provides an on-resistance of approximately 100 kΩ and an off-resistance exceeding 1 TΩ, enabling fast reset capability while preserving high-resistance characteristics in normal operation.

In various implementations, first circuit 130 is configured to generate and regulate the bias voltage that is applied to resistor array 120, enabling programmable resistance tuning and stable operation across varying conditions. For example, the term "bias voltage" may refer to a controlled voltage applied to a circuit element to establish a desired operating condition. The bias voltage generated by first circuit 130 determines the effective resistance of resistor array 120 by controlling the operating point of resistor units 121*a-d*. Depending on the implementation, first circuit 130 may generate the bias voltage based on external control signals, feedback regulation, predefined resistance settings, and/or other control mechanisms.

In some examples, the bias voltage may be applied to the deep-n-well (DNW) region of the transistor structure in resistor array 120 to reduce leakage currents. By establishing a stable potential for the DNW, first circuit 130 helps suppress leakage paths that could otherwise degrade signal integrity. Additionally, the bias voltage is used to stabilize the gate potential of the pseudo-resistor transistors, ensuring that the resistance remains predictable across variations in process, voltage, and temperature (PVT) conditions. By compensating for these variations, first circuit 130 minimizes the effects of fabrication inconsistencies and environmental fluctuations, allowing resistor array 120 to function reliably across different operating scenarios.

According to some embodiments, second circuit 140 is configured to generate and regulate a bias current that is applied to first circuit 130, enabling precise control of the bias voltage supplied to resistor array 120. For example, the term "bias current" may refer to a controlled current used to establish or regulate the operating conditions of a circuit. The bias current plays an important role in determining the resistance characteristics of resistor array 120, as it directly influences the voltage levels applied to the pseudo-resistor structure (e.g., resistor units 121*a-d*). By controlling the bias current, second circuit 140 ensures that the pseudo-resistor maintains a stable and tunable resistance while minimizing PVT variations. Depending on the implementation, the bias current may be generated from a constant current source, a proportional-to-absolute-temperature (PTAT) current source, or a combination of both.

Figure 2:
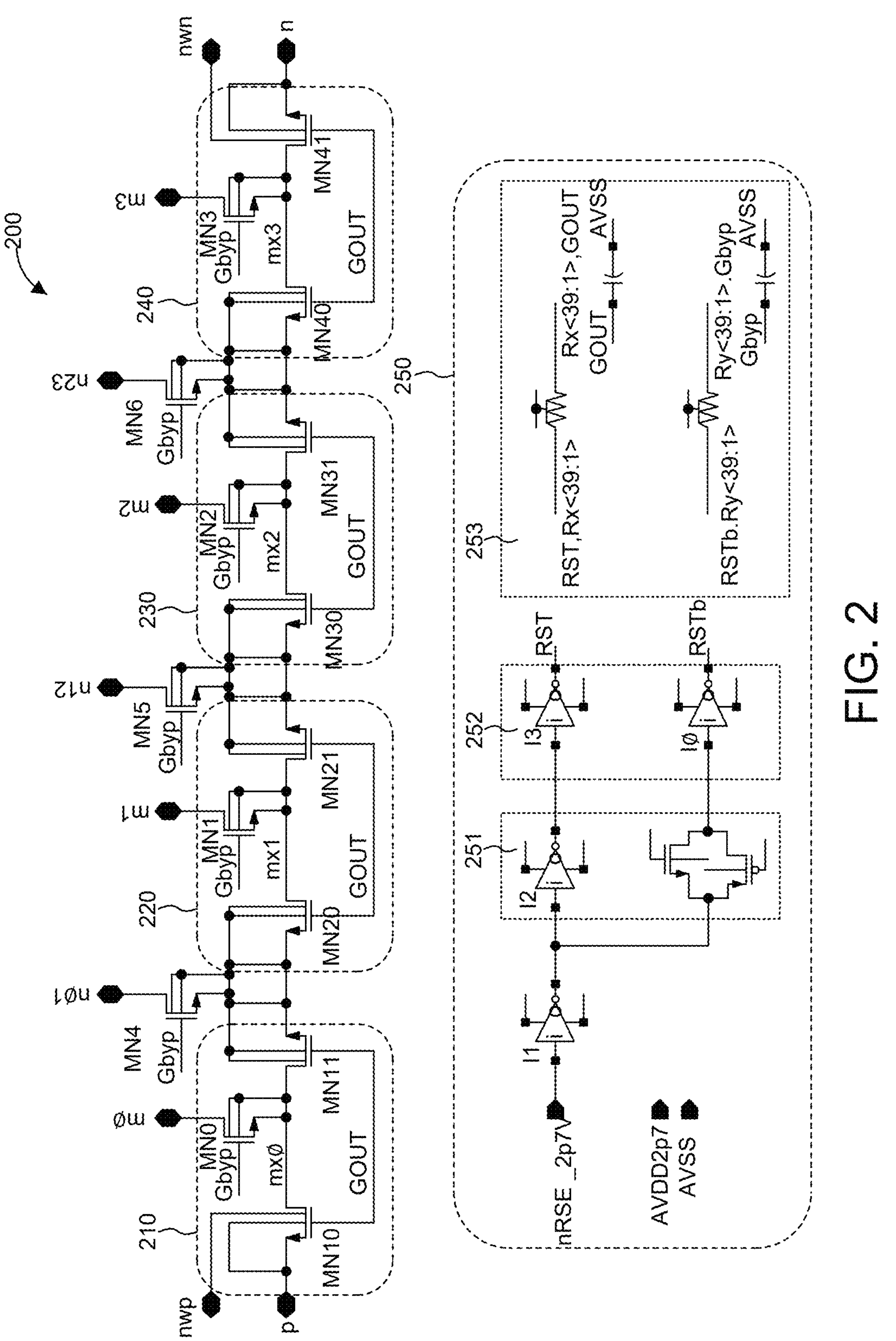
FIG. 2 is a simplified diagram illustrating a reset switch according to embodiments of the subject technology.

FIG. 2 is a simplified diagram illustrating a reset switch 200 according to embodiments of the subject technology. This diagram merely provides an example, which should not unduly limit the scope of the claims. One of ordinary skill in the art would recognize many variations, alternatives, and modifications.

In some implementations, reset switch 200 may be part of a pseudo-resistor system (e.g., system 100 of FIG. 1). Reset switch 200 may configured to provide a low-resistance bypass path for a high-resistance pseudo-resistor (e.g., resistor array 120 of FIG. 1) to enable a rapid reset operation. When enabled, reset switch 200 temporarily reduces the total resistance of the system, facilitating charge dissipation and restoring a predefined operating condition. Reset switch 200 may be particularly useful in high-impedance circuits where excessive charge accumulation, leakage currents, or transient effects could alter system performance.

In various embodiments, reset switch 200 may include one or more reset units, such as reset units 210, 220, 230, and 240. For example, the term "reset unit" may refer to an electronic circuit or component within a reset switch that is configured to selectively modify the impedance of a system. A reset unit may be implemented using various electronic elements, such as MOSFETs, BJTs, JFETs, transmission gates, electromechanical relays, and/or the like.

According to various embodiments, reset units 210, 220, 230, and 240 may be associated with resistor units (e.g., resistor units 121*a-b* of FIG. 1) in the main resistance path (e.g., resistor array 120 of FIG. 1). For example, each reset unit operates in parallel with its corresponding resistor unit and is configured to operate as a bypass switch that selectively reduces the total resistance of the system, providing an alternative low-resistance conduction path when activated.

In some embodiments, each reset unit comprises a pair of transistors that form a conduction path when enabled, effectively bypassing the high-resistance pseudo-resistor. As shown, reset unit 210 includes transistors MN10 and MN11. Reset unit 220 includes transistors MN20 and MN21. Reset unit 230 includes transistors MN30 and MN31. Reset unit 240 includes transistors MN40 and MN41. For example, the term "transistor" may refer to a semiconductor device used to control the flow of electrical current. Examples of transistors may include, without limitation, MOSFETs, BJTs, JFETs, and/or the like.

In certain configurations, the pair of transistors within each reset unit may be coupled via an intermediate node, which serves as a voltage reference and biasing point to regulate the reset operation. As an example, in reset unit 210, MN10 and MN11 may be coupled via intermediate node mx0. In reset unit 220, MN20 and MN21 may be coupled via intermediate node mx1. In reset unit 230, MN30 and MN31 may be coupled via intermediate node mx2. In reset unit 240, MN40 and MN41 may be coupled via intermediate node mx3. In some cases, each intermediate node (e.g., mx0-mx3) may be biased from a buffered corresponding intermediate node in the main pseudo-resistor branch (e.g., resistor array 120 of FIG. 1) via switches MN0-MN3. The buffered intermediate nodes in the reset units provide a stable voltage reference, ensuring that reset switch 200 mirrors the electrical characteristics of the main resistance path.

According to various embodiments, each transistor may include a drain terminal, a source terminal, a gate terminal, and a body terminal. For instance, the drain-source path forms the primary conduction channel through which current flows when the transistor is in an on-state. The gate terminal modulates the conductivity between the drain and source based on a control signal, effectively enabling or disabling the conduction path. The body terminal may be electrically coupled to the source terminal in certain configurations to stabilize the operating characteristics of the transistor and minimize leakage currents.

In some embodiments, each transistor may be disposed within an isolated well region to further enhance leakage suppression and noise isolation. For example, the term "isolated well region" may refer to a semiconductor well structure that electrically isolates one or more transistors from the surrounding substrate. Examples of isolated well regions may include, without limitation, deep-n-well (DNW) structures, triple-well isolation regions, silicon-on-insulator (SOI) substrates, and/or the like. For instance, each transistor may be integrated into a DNW structure, which provides isolation and biasing control to minimize leakage currents and ensure consistent electrical behavior.

In some examples, reset units 210 and 240 may function as end reset units positioned at the outermost terminals of reset switch 200. The end units may be responsible for interfacing with the buffered terminal nodes (e.g., p and n terminals) of the main pseudo-resistor branch (e.g., resistor array 120 of FIG. 1). The DNW regions (e.g., nwp and nwn) of reset units 210 and 240 may be biased from the buffered p and n terminals, respectively. For instance, the DNW region (e.g., nwp) of reset unit 210 is coupled to the buffered p terminal via a biasing circuit, which may include a voltage buffer or a direct connection depending on the implementation. The voltage buffer isolates the DNW from external variations while ensuring that the DNW potential remains consistent with the operating voltage at the p terminal. Similarly, in reset unit 240, the DNW terminal (e.g., nwn) is coupled to the buffered n terminal through a biasing circuit, allowing the DNW region of reset unit 240 to track the potential of the n terminal.

In some implementations, transistor MN11 of reset unit 210 and transistor MN20 of reset unit 220 may share their DNW, body, and source terminals, with biasing provided from a corresponding intermediate node in resistor array 120 (not shown) via switch MN4. Similarly, transistor MN21 of reset unit 220 and transistor MN30 of reset unit 230 share their DNW, body, and source terminals, with biasing supplied through switch MN5. Transistor MN31 of reset unit 230 and transistor MN40 of reset unit 240 share their DNW, body, and source terminals, with biasing supplied through switch MN6. This configuration helps to equalize potential differences across reset switch 200, reducing variations that could introduce leakage currents and distort system performance.

As an example, the corresponding resistor unit (e.g., resistor unit 121*a* of FIG. 1) of reset unit 210 may include an intermediate node (e.g., a first node) between its two transistors, where the first node is characterized by a first voltage. The first voltage may be determined by the operating conditions of resistor unit 121*a* and may depend on factors such as biasing, leakage currents, and process variations. To ensure that reset unit 210 exhibits a similar electrical response, intermediate node mx0 (e.g., a second node) between transistors MN10 and MN20 in reset unit 210 may be characterized by a second voltage, which is associated with the first voltage of the corresponding resistor unit. For instance, the second voltage may be derived from a buffered version of the first voltage at the corresponding intermediate node of resistor unit 121*a*.

In various implementations, reset units 220 and 230—which may serve as middle reset transistor units—are placed between the end units (e.g., reset units 210 and 240) within reset switch 200. The middle reset units may be configured to provide an intermediate conduction path between the end reset units when reset switch 200 is activated, ensuring smooth charge dissipation and maintaining consistent electrical behavior. For example, reset unit 220 may be coupled to reset unit 210 via transistor MN4. Reset unit 230 may be coupled to reset unit 220 via transistor MN5. Reset unit 240 may be coupled to reset unit 230 via transistor MN6. In some embodiments, each middle reset unit (e.g., reset units 220 and 230) may comprise a pair of transistors (e.g., MN20 and MN21 in reset unit 220, MN30 and MN31 in reset unit 230). To ensure biasing uniformity and leakage minimization, the DNW, body, and source terminals of each middle reset unit may be shorted together and shared with adjacent transistors.

In some cases, the middle reset units 220 and 230 receive bias voltages from buffered corresponding intermediate nodes in the main pseudo-resistor branch (e.g., resistor array 120 of FIG. 1) via switches MN4-6. For instance, an intermediate node (e.g., a third node) between resistor units 121*b* and 121*c* of FIG. 1 may correspond to an intermediate node (e.g., a fourth node) between reset units 220 and 230. The third node may be characterized by a third voltage, and the fourth node may be characterized by a fourth voltage. The fourth voltage may be associated with the third voltage to ensure that the reset switch 200 accurately tracks the electrical characteristics of the main pseudo-resistor path. These intermediate nodes function as voltage references, ensuring consistent electrical characteristics across reset switch 200 and facilitating stable and predictable switching behavior.

In various implementations, reset switch 200 may further include control circuit 250, which is configured to generate control signals for enabling and disabling reset switch 200. In some examples, control circuit 250 receives an incoming reset signal (e.g., nRST_2p7V), which serves as the control input for toggling reset switch 200 between an active (e.g., low-resistance) state and an inactive (e.g., high-resistance) state. Control circuit 250 may first process the reset signal through an intermediate stage 251 to generate two complementary output signals (e.g., RST and RSTb) at the output of the inverting stage 252. To further refine the switching behavior and minimize unwanted noise, the complementary output signals may be passed through filter 253 (e.g., an RC low-pass filter), which may be configured to attenuate high-frequency components from the reset signal, thereby smoothing transition edges and preventing abrupt voltage changes that could otherwise introduce transient noise or signal coupling into the system.

In some embodiments, the RST and RSTb signals may be applied to control the switching elements within reset switch 200. For instance, the RST signal may be applied to the gate terminals of transistors MN10, MN11, MN20, MN21, MN30, MN31, MN40, and MN41 at node GOUT, selectively enabling or disabling the conduction paths within reset units 210, 220, 230, and 240. In some examples, the RSTb signal may be configured to drive the gate terminals of transistors MN0-MN6 at node Gbyp, ensuring proper biasing and operation of the intermediate switching elements within reset switch 200.

In normal operation, when reset switch 200 is disabled, the transistors in the reset units remain in an off state, presenting an extremely high resistance (e.g., 1 TΩ or higher) to minimize leakage and prevent interference with the normal high-resistance operation of the pseudo-resistor system. When reset switch 200 is activated, the transistors in the reset units turn on, providing a significantly lower resistance path (e.g., approximately 100 kΩ) that facilitates rapid charge redistribution, thereby restoring the pseudo-resistor system to a predefined operating condition.

Figure 3:
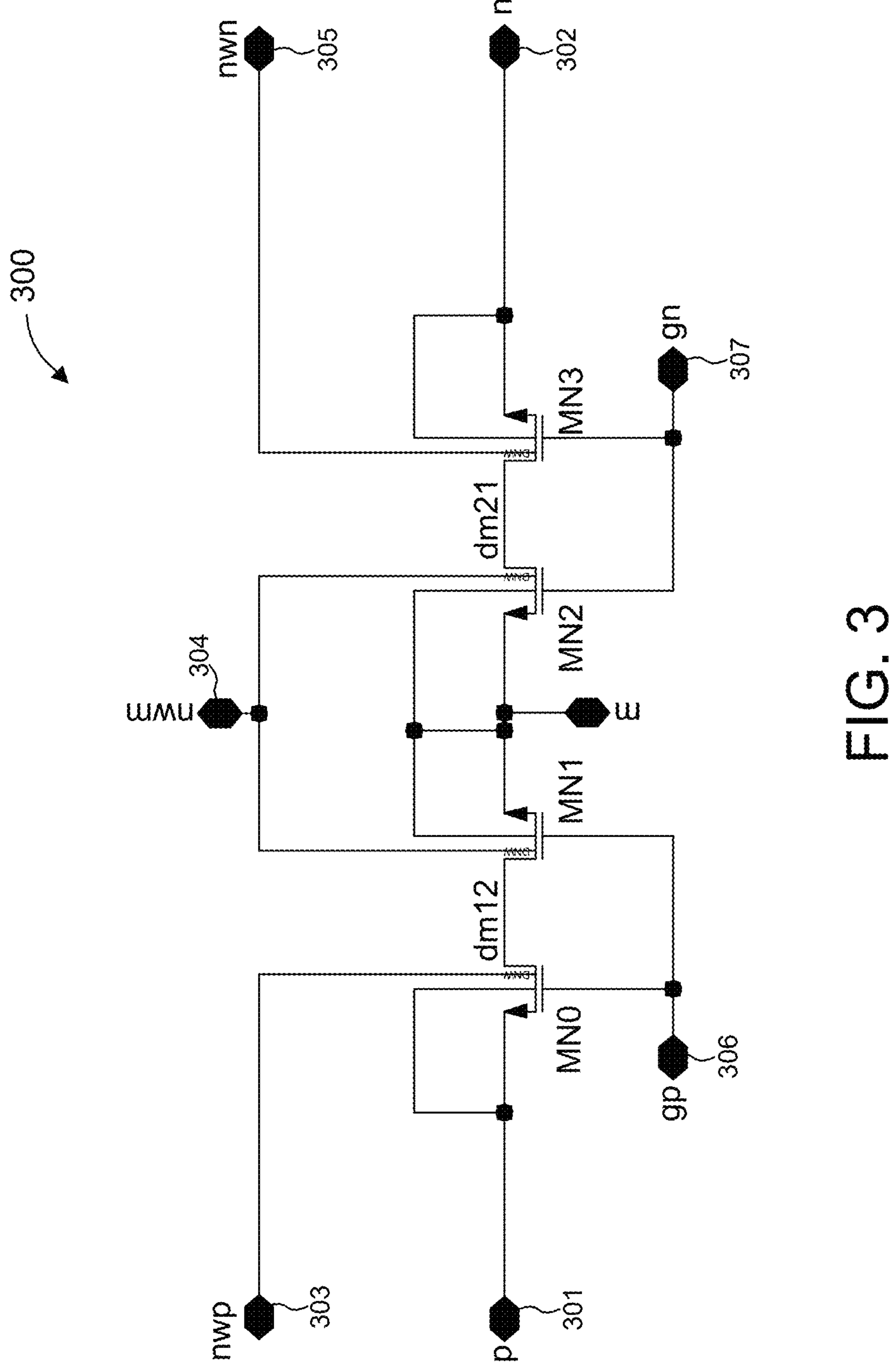
FIG. 3 is a simplified diagram illustrating a resistor unit according to embodiments of the subject technology.

FIG. 3 is a simplified diagram illustrating a resistor unit 300 according to embodiments of the subject technology. This diagram merely provides an example, which should not unduly limit the scope of the claims. One of ordinary skill in the art would recognize many variations, alternatives, and modifications. In some implementations, resistor unit 300 may be part of a pseudo-resistor system (e.g., system 100 of FIG. 1) and may be configured to provide a high-resistance path between two circuit terminals—such as terminal 301 (e.g., p terminal) and terminal 302 (e.g., n terminal)—enabling the implementation of high-pass filtering, signal conditioning, and other impedance-sensitive operations.

In various embodiments, resistor unit 300 may include one or more transistors (e.g., transistors MN0, MN1, MN2, and MN3). For instance, each transistor may be implemented as negative-MOS (NMOS) transistors, operating in weak inversion or subthreshold conduction to achieve extremely high resistance values. The resistance path may be formed between an input terminal (e.g., terminal 301) and an output terminal (e.g., terminal 302) through the conduction of transistors MN0-3. Each transistor may include a source terminal, a drain terminal, a gate terminal, and a body terminal. In certain configurations, each transistor in resistor unit 300 may have its body terminal and source terminal (B/S) shorted together to enhance electrical stability and minimize leakage currents.

In some embodiments, the source terminals of transistor MN0 and transistor MN3 may be coupled to terminal 301 and terminal 302, respectively, forming the primary resistance path. The drain terminal of transistor MN0 may be coupled to the drain terminal of transistor MN1 via intermediate node dm12. Similarly, the drain terminal of transistor MN2 may be coupled to the drain terminal of transistor MN3 via intermediate node dm21. This mirrored, symmetrical structure ensures that the pseudo-resistor exhibits consistent electrical characteristics, improving linearity and stability across a wide range of operating conditions. In other aspects, other arrangements such as cascaded or folded-cascade structures may be implemented.

In some embodiments, each transistor (e.g., transistors MN0, MN1, MN2, and MN3) may be disposed within an isolated well region to further enhance leakage suppression and noise isolation. For example, each transistor may be placed within its corresponding DNW regions, such as DNW 303 (e.g., nwp), DNW 304 (e.g., nwm), and DNW 305 (e.g., nwn). The DNW regions provide electrical isolation from the bulk substrate, reducing substrate noise coupling and unwanted leakage paths. Depending on the implementation, a voltage buffer (not shown) may be used to bias the DNW at the same potential as the source terminal, effectively reducing body-to-DNW voltage differences. In other examples, the voltage buffer may be omitted, and the DNW may be directly connected to a fixed high voltage, which is beneficial for reducing circuit complexity.

In some embodiments, the middle transistors MN1 and MN2 may be configured to extend the linear range of resistor unit 300. For example, the transistors MN1 and MN2 have their body-source (B/S) terminals and DNW regions (e.g., DNW 304) shorted together and shared, forming an extended high-resistance path while maintaining consistent electrical characteristics. This configuration effectively doubles the linear range while ensuring uniform potential distribution across the transistors in resistor unit 300.

In some cases, an additional voltage buffer (not shown) may be required to bias node m to the DNW 304 (e.g., nwm), ensuring that the body-source terminals of the middle transistors remain at the correct operating potential. Depending on the implementation, the number of transistors in resistor unit 300 may be adjusted to optimize performance. For instance, additional transistors may be incorporated to further extend the linear range. Conversely, in applications where extended linearity is not required, the middle transistors MN1 and MN2 may be omitted, allowing MN0 and MN3 to be directly coupled together to reduce circuit complexity.

In various implementations, resistor unit 300 may further include gate terminal 306 (e.g., gp) and gate terminal 307 (e.g., gn), which may serve as control nodes for tuning the resistance characteristics. For example, the gate terminals of transistors MN0 and MN1 may be coupled together and connected to gate terminal 306. The gate terminals of transistors MN2 and MN3 may be coupled together and connected to gate terminal 307. Gate terminals 306 and 307 may receive bias voltages from an external circuit (e.g., first circuit 130 of FIG. 1) to regulate the weak-inversion conduction characteristics of the transistors. By adjusting the bias voltages at gp and gn, the effective resistance of resistor unit 300 can be finely tuned to meet specific application requirements.

As an example, resistor unit 300 may be configured to provide a first resistance between terminal 301 (e.g., p terminal) and terminal 302 (e.g., n terminal). The first resistance may be determined by the biasing conditions applied to the gate terminals 306 and 307, allowing for tunable resistance characteristics. In some implementations, the first resistance may be in the gigaohm (GΩ) range, enabling the pseudo-resistor to function effectively in high-impedance applications.

It is to be appreciated that the symmetrical gate configuration ensures that the pseudo-resistor maintains a stable and predictable resistance value across PVT variations. In some embodiments, the gate terminals 306 and 307 may be biased using a replica bias circuit to compensate for variations and maintain uniform electrical characteristics across all transistors within resistor unit 300. According to various embodiments, resistor unit 300 may be part of a larger resistor array in which multiple resistor units are cascaded to achieve high resistance values. Each resistor unit within the array may be individually controlled using bias voltages applied to the transistor gate terminals, allowing for programmable resistance tuning. By leveraging voltage buffers and replica gate bias circuitry (e.g., first circuit 130 of FIG. 1), resistor unit 300 maintains stable operation across varying environmental and process conditions.

In certain implementations, a reset operation may be triggered when the pseudo-resistor experiences excessive charge accumulation, leakage-induced drift, or saturation effects that degrade its intended high-resistance characteristics. Such conditions may arise in high-impedance circuits where transient disturbances, electrostatic charge buildup, or prolonged operation at extreme bias conditions cause an undesirable shift in the effective resistance of resistor unit 300. To mitigate these effects, a reset mechanism (e.g., reset switch 200 of FIG. 2) may be activated to provide a second resistance between terminal 301 (e.g., p terminal) and terminal 302 (e.g., n terminal). The second resistance may be lower than the first resistance, effectively creating a temporary low-impedance path that facilitates charge redistribution and restores the pseudo-resistor to a predefined operating condition.

While the above is a full description of the specific embodiments, various modifications, alternative constructions and equivalents may be used. Therefore, the above description and illustrations should not be taken as limiting the scope of the subject technology which is defined by the appended claims.

What is claimed is:

1. An apparatus comprising:

a first resistor unit comprising a first terminal and a second terminal, the first resistor unit being configured to provide a first resistance between the first terminal and the second terminal, the first resistor unit further comprising a first transistor coupled to the first terminal and a second transistor coupled to the second terminal;

a first reset unit coupled to the first terminal and the second terminal, the first reset unit being configured to provide a second resistance between the first terminal and the second terminal in response to a first control signal, the second resistance being lower than the first resistance;

a first circuit coupled to the first resistor unit, the first circuit being configured to adjust the first resistance by providing a first bias voltage to the first resistor unit; and a second circuit coupled to the first circuit, the second circuit being configured to adjust the first bias voltage by providing a first bias current to the first circuit.

2. The apparatus of claim 1, wherein the first transistor comprises a first source terminal and a first body terminal, the first source terminal is electrically coupled to the first body terminal.

3. The apparatus of claim 1, wherein the first reset unit comprises a first isolated well region coupled to the first terminal.

4. The apparatus of claim 1, wherein the first terminal is coupled to the second terminal via a first node, the first node being characterized by a first voltage.

5. The apparatus of claim 4, wherein the first reset unit comprises a third transistor and a fourth transistor, the third transistor is coupled to the fourth transistor via a second node, the second node is characterized by a second voltage, the second voltage is associated with the first voltage.

6. The apparatus of claim 1, further comprising a second resistor unit coupled to the first resistor unit via a third node, the third node being characterized by a third voltage.

7. The apparatus of claim 6, further comprising a second reset unit coupled to the first reset unit via a fourth node, the fourth node being characterized by a fourth voltage, the fourth voltage being associated with the third voltage.

8. The apparatus of claim 1, wherein the first resistor unit further comprises a second isolated well region and a fifth transistor, the fifth transistor is coupled to the first transistor and the second isolated well region.

9. The apparatus of claim 8, wherein the first resistor unit further comprises a sixth transistor, the sixth transistor is coupled to the second transistor and the second isolated well region.

10. An apparatus comprising:

a first resistor unit comprising a first terminal and a second terminal, the first resistor unit being configured to provide a first resistance between the first terminal and the second terminal, the first resistor unit further comprising a first transistor coupled to the first terminal and a second transistor coupled to the second terminal;

a first reset unit coupled in series with the first resistor unit, the first reset unit being configured to provide a second resistance between the first terminal and the second terminal in response to a first control signal, the second resistance being lower than the first resistance;

a first circuit coupled to the first resistor unit, the first circuit being configured to adjust the first resistance by providing a first bias voltage to the first resistor unit; and a second circuit coupled to the first circuit, the second circuit being configured to adjust the first bias voltage by providing a first bias current to the first circuit.

11. The apparatus of claim 10, wherein the first transistor comprises a first source terminal and a first body terminal, the first source terminal is electrically coupled to the first body terminal.

12. The apparatus of claim 10, wherein the first terminal is coupled to the second terminal via a first node, the first node being characterized by a first voltage.

13. The apparatus of claim 12, wherein the first reset unit comprises a third transistor and a fourth transistor, the third transistor is coupled to the fourth transistor via a second node, the second node is characterized by a second voltage, the second voltage is associated with the first voltage.

14. The apparatus of claim 12, wherein the first node is configured to receive a second bias voltage from the first circuit.

15. The apparatus of claim 10, further comprising a second resistor unit coupled to the first resistor unit via a third node, the third node being characterized by a third voltage.

16. The apparatus of claim 15, further comprising a second reset unit coupled to the first reset unit via a fourth node, the fourth node being characterized by a fourth voltage, the fourth voltage being associated with the third voltage.

17. An apparatus comprising:

a first resistor unit comprising a first terminal and a second terminal, the first resistor unit being configured to provide a first resistance between the first terminal and the second terminal, the first resistor unit further comprising a first transistor coupled to the first terminal and a second transistor coupled to the second terminal;

a first reset unit coupled to the first resistor unit, the first reset unit comprising a third transistor coupled to the first terminal and a fourth transistor coupled to the second terminal, the first reset unit being configured to provide a second resistance between the first terminal and the second terminal in response to a first control signal, the second resistance being lower than the first resistance;

a first circuit coupled to the first resistor unit, the first circuit being configured to adjust the first resistance by providing a first bias voltage to the first resistor unit; and a second circuit coupled to the first circuit, the second circuit being configured to adjust the first bias voltage by providing a first bias current to the first circuit.

18. The apparatus of claim 17, wherein:

the first terminal is coupled to the second terminal via a first node, the first node being characterized by a first voltage; and the third transistor is coupled to the fourth transistor via a second node, the second node is characterized by a second voltage, the second voltage is associated with the first voltage.

19. The apparatus of claim 17, further comprising a second resistor unit coupled to the first resistor unit via a third node, the third node being characterized by a third voltage.

20. The apparatus of claim 19, further comprising a second reset unit coupled to the first reset unit via a fourth node, the fourth node being characterized by a fourth voltage, the fourth voltage being associated with the third voltage.

* * * * *